United States Patent
Wang et al.

(10) Patent No.: US 9,779,017 B2
(45) Date of Patent: Oct. 3, 2017

(54) DATA STORAGE DEVICE AND DATA ACCESSING METHOD THEREOF

(71) Applicant: Silicon Motion, Inc., Jhubei (TW)

(72) Inventors: Chi-Lung Wang, Zhubei (TW); Chia-Ta Huang, Zhubei (TW)

(73) Assignee: Silicon Motion, Inc., Jhubei (TW)

( * ) Notice: Subject to any disclaimer, the term of this patent is extended or adjusted under 35 U.S.C. 154(b) by 0 days.

(21) Appl. No.: 15/073,062

(22) Filed: Mar. 17, 2016

(65) Prior Publication Data

US 2016/0283367 A1    Sep. 29, 2016

(30) Foreign Application Priority Data

Mar. 25, 2015  (TW) .............................. 104109491 A

(51) Int. Cl.
*G06F 12/00* (2006.01)
*G11C 29/00* (2006.01)
*G06F 12/02* (2006.01)
*G06F 11/10* (2006.01)
*G11C 16/06* (2006.01)

(52) U.S. Cl.
CPC ...... *G06F 12/0246* (2013.01); *G06F 11/1068* (2013.01); *G11C 29/70* (2013.01); *G11C 29/76* (2013.01); *G06F 2212/7201* (2013.01); *G11C 16/06* (2013.01); *G11C 29/832* (2013.01)

(58) Field of Classification Search
None
See application file for complete search history.

(56) References Cited

U.S. PATENT DOCUMENTS

| | | | | |
|---|---|---|---|---|
| 5,295,255 A * | 3/1994 | Malecek | ................ | G11C 16/10 711/1 |
| 2002/0154543 A1* | 10/2002 | Conley | ................ | G06F 12/0246 365/185.11 |
| 2003/0221144 A1* | 11/2003 | Shimada | ................ | G11C 29/56 714/710 |
| 2004/0022249 A1* | 2/2004 | Katayama | ................ | G11C 16/349 370/395.7 |
| 2004/0085821 A1* | 5/2004 | Kim | ................ | G11C 29/76 365/200 |
| 2005/0193233 A1* | 9/2005 | Magliocco | ................ | G11C 29/56 714/5.1 |
| 2005/0281089 A1* | 12/2005 | Sukegawa | ................ | G11C 16/26 365/201 |
| 2013/0007544 A1* | 1/2013 | Nemazie | ................ | G11C 29/808 714/723 |
| 2013/0077419 A1* | 3/2013 | Asano | ................ | G11C 7/1036 365/200 |
| 2013/0151752 A1* | 6/2013 | Hsiao | ................ | G06F 11/1048 711/103 |

(Continued)

*Primary Examiner* — Kaushikkumar Patel
(74) *Attorney, Agent, or Firm* — Wang Law Firm, Inc.

(57) ABSTRACT

A data storage device including a flash memory and a controller. The flash memory includes a plurality of dies having a plurality of columns, wherein each of the columns is constituted by a plurality of sectors. The controller performs a read operation or a write operation from a first column to an Nth column in response to a read command or a write command, and skips at least two columns within the range of the first column to the Nth column according to a first bad column data set, wherein the first bad column data set has a starting address and the number of columns.

3 Claims, 2 Drawing Sheets

(56) References Cited

U.S. PATENT DOCUMENTS

2013/0229886 A1* 9/2013 Denham ............ G11C 29/4401
                                                                           365/200
2015/0179279 A1* 6/2015 Yen ..................... G11C 29/00
                                                                           365/200

* cited by examiner

DATA STORAGE DEVICE AND DATA ACCESSING METHOD THEREOF

CROSS REFERENCE TO RELATED APPLICATIONS

This application claims priority of Taiwan Patent Application No. 104109491, filed on Mar. 25, 2015, the entirety of which is incorporated by reference herein.

BACKGROUND OF THE INVENTION

Field of the Invention

The present invention relates to a data-storage device, and in particular to a data-storage device capable of skipping bad column according to bad column data sets.

Description of the Related Art

Flash memory is a type of non-volatile memory which can be electronically erased or re-written. It is mainly used in memory cards, USB flash devices, eMMC and solid-state disks, for the transportation of information between computer devices and digital products.

The flash memory includes a plurality of blocks, and each of the blocks has a plurality of pages arranged to store data. The minimum erase unit of flash memory is a block, and the minimum write unit of flash memory is a page. Certain columns of the flash memory may be inaccessible due to particles or mask defects in manufacturing. These are referred to as bad columns.

BRIEF SUMMARY OF THE INVENTION

A detailed description is given in the following embodiments with reference to the accompanying drawings.

The present invention provides a data storage device. The data storage device includes a flash memory and a controller.

The flash memory includes a plurality of dies, and each of the dies has a plurality of columns, wherein each of the columns is constituted by a plurality of sectors. The controller performs a read operation or a write operation from a first column to an Nth column in response to a read command or a write command, and skips at least two columns within the range of the first column to the Nth column according to a first bad column data set during the read operation and the write operation, wherein the first bad column data set has first data and second data, the first data is a starting address, and the second is the number of columns.

The present invention provides another data storage device. The data storage device includes a flash memory and a controller. The flash memory includes a plurality of dies, and each of the dies has a plurality of columns constituted by a plurality of sectors. The bad column table includes a plurality of bad column data sets arranged to record at least one of the columns which is unable to use, wherein the bad column data set has at least one first bad column data set, the first bad column data set has first data and second data, the first data is a starting address, and the second data is the number of columns.

The present invention further provides data accessing method applied to a data storage device. The flash memory includes a plurality of dies, and each of the dies has a plurality of columns constituted by a plurality of sectors. The data accessing method comprises: receiving a read command indicating to read from a first column to an Nth column or a write command indicating to write data from the first column to the Nth column; reading at least one first bad column data set corresponding to the die which is going to be accessed from a bad column table; and performing a read operation from the first column to the Nth column in response to the read command or performing a write operation from the first column to the Nth column in response to the write command, and skipping at least two columns within the range of the first column to the Nth column according to the obtained first bad column data set during the read operation and the write operation, wherein the first bad column data set comprises first data and second data, the first data is a starting address, and the second data is the number of columns.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
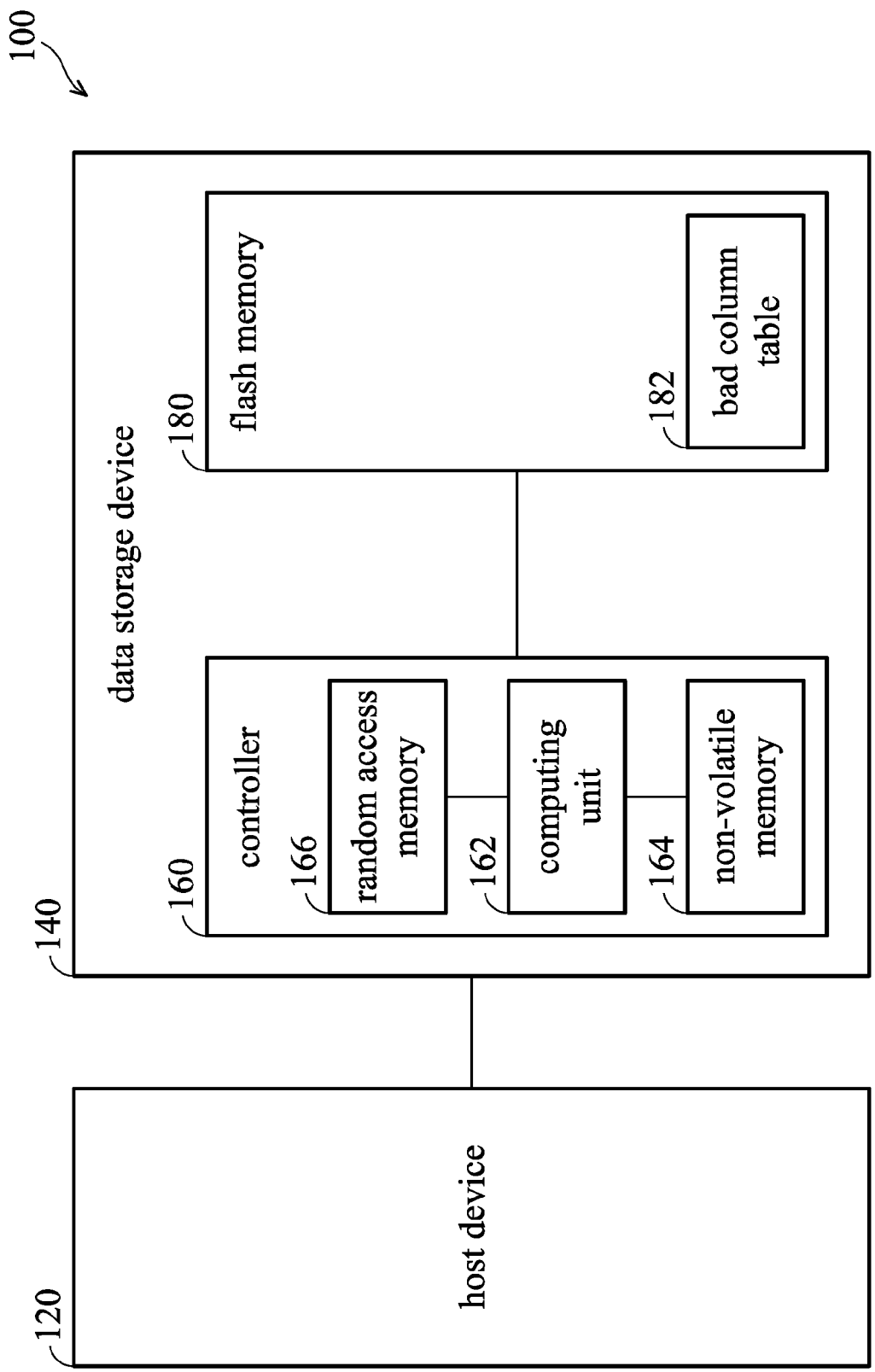
FIG. 1 is a schematic diagram illustrating an embodiment of an electronic system of the present invention.

FIG. 1 is a schematic diagram illustrating an embodiment of an electronic system of the present invention. The electronic system 100 includes a host device 120 and a data storage device 140. The data storage device 140 includes a flash memory 180 and a controller 160, and capable of operating in response to the commands of the host device 110. The controller 160 includes a computing unit 162, a non-volatile memory 164 (ROM) and a random access memory 166 (RAM). The non-volatile memory 164, the program code stored in the non-volatile memory 164 and data stored in the non-volatile memory 164 constitute firmware executed by the processing unit 162, and the controller 160 is configured to control the flash memory 180 based on the firmware. The random access memory 166 (RAM) is arranged to load the program codes and parameters to provide the program codes and parameters to the controller 160. The flash memory 180 includes a plurality of dies, each of the dies includes a plurality of columns and a plurality of rows, and each of the columns and rows is constituted by a plurality of sectors, wherein the sectors of the flash memory 180 are further grouped into a plurality of pages of a plurality of blocks. It should be noted that a sector arranged to store user data and a sector arranged to store ECC parity can constitute a chunk, wherein the chunk is the minimum unit of the ECC correction, but it is not limited thereto. In other embodiments, the chunk can be constituted by two sectors arranged to store user data and two sectors arranged to store the ECC parity.

It should be noted that, the certain columns of the flash memory may be inaccessible due to particles or mask defects in the manufacturing process, referred to as bad columns.

In one of the embodiments, the controller 160 perform a read operation from a first column to an Nth column in response to a read command or perform write operation from the first column to the Nth column in response to a write command, and skips at least two columns of the first column to the Nth column according to a first bad column data set during the read operation and write operation. It should be noted that the first bad column data set includes first data and second data, the first data is a starting address, and the second data is the number of columns. Therefore, the controller 160 can locate an address according to the first data which is a starting address, and determine how many numbers of columns are going to be skipped according to the second data which is the number of columns, but it is not limited thereto. For example, when 50 bad columns of the flash memory need to be skipped, the controller 160 can skip 50 continuous columns from the located column according to the first data and the second data, wherein the first data and the second data of the first bad column data set only requires two chunks of memory space to be stored.

In another embodiment, the controller 160 skips one column of the first column to the Nth column according to a second bad column data set during the read operation and the write operation. It should be noted that the second bad column data set includes a third data, and the third data indicates an address of a column of the flash memory 180. Therefore, the controller 160 can locate an address according to the third data of the second bad column data set to skip the column on the address, but it is not limited thereto. For example, when 50 bad columns of the flash memory need to be skipped, the controller 160 can skip 50 columns according to the third data of 50 second bad column data sets, wherein each of the third data of the second bad column data sets requires a chunk of memory space. Therefore, in this embodiment, the controller 160 needs to read the data of 50 chunks to skip 50 columns.

In one of the embodiments, the flash memory 180 stores a bad column table 182. The bad column table 182 includes a plurality of die areas to store the bad column data sets of the dies. The bad column data set is arranged to record the bad columns of the flash memory 180, wherein the bad column data set includes at least one first bad column data set. As described above, each of the first bad column data sets includes one first data and one second data, the first data is a starting address, and the second is the number of columns. In another embodiment, the bad column data set further includes at least one second bad column data set. As described above, each of the second bad column data set includes third data, the third data indicates an address of one of the columns.

The controller 160 reads the bad column table 182 to obtain the first bad column data set and/or the second bad column data set before or during the read operation and the write operation. In one of the embodiments, the controller 160 loads the bad column table 182 onto the random access memory 166 from the flash memory 180 when the data storage device 140 is powered on, so that the controller 160 can directly access the bad column table 182 from the random access memory 166 bad column table 182. Moreover, the controller 160 determines which die is going to be accessed according to the read command or the write command, and reads the data corresponding to the determined die from the bad column table 182. More specifically, the controller 160 determines which die is going to be accessed by the read command or the write command, and reads the bad column data sets corresponding to the determined die from the bad column table 182. Next, the controller 160 performs a read operation in response to the read command to read data from the first column to the Nth column of the flash memory 180 or a write operation in response to the write command to write data into from the first column to the Nth column of the flash memory 180, and skips at least one column of the first column to the Nth column according to the bad column data set during the read operation and the write operation, wherein the skipped column is corresponding to the bad column data set.

Figure 2:
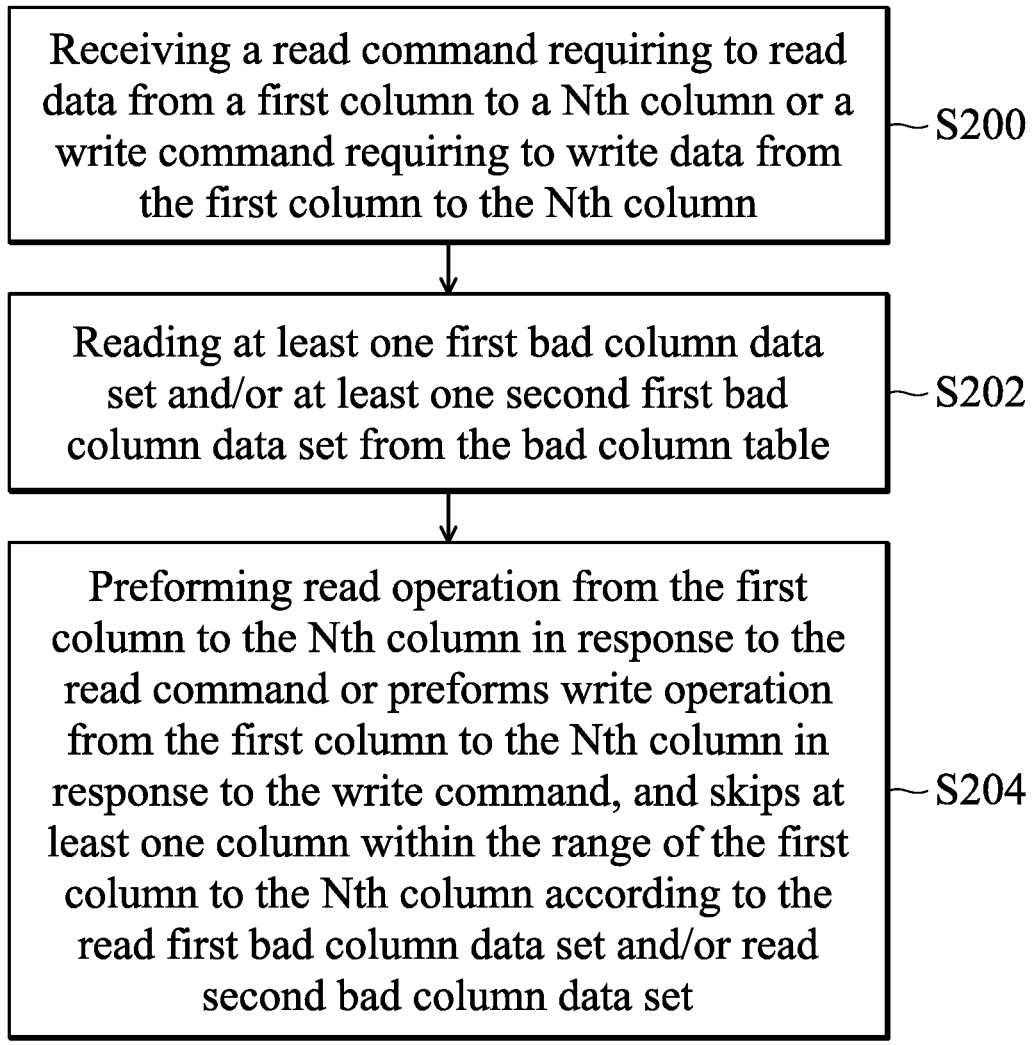
FIG. 2 is a flowchart of a data accessing method according to an embodiment of the present invention.

FIG. 2 is a flowchart of a data accessing method according to an embodiment of the present invention. The data accessing method is applied to the data storage device 140 of FIG. 1. The process starts at step S200.

In step S200, the controller 160 receives a read command requiring to read data from a first column to an Nth column or a write command requiring to write data from the first column to the Nth column.

Next, in step S202, the controller 160 reads at least one first bad column data set and/or at least one second first bad column data set from the bad column table 182.

Next, in step S204, the controller 160 performs a read operation from the first column to the Nth column in response to the read command or performs a write operation from the first column to the Nth column in response to the write command, and skips at least one column within the range of the first column to the Nth column according to the read first bad column data set and/or read second bad column data set. More specifically, the controller 160 determines the die which is going to be accessed by the read command or the write command and reads the bad column data sets corresponding to the determined die from the bad column table 182. It should be noted that the controller 160 locates an address according to the first data of the first bad column data set, and determines how many numbers of columns are going to be skipped according to the second data of the first bad column data set, but it is not limited thereto. The controller 160 locates an address according to the third data of the second bad column data set to skip the column on the address, but it is not limited thereto. The process ends at step S204.

As described above, the data storage device 140 and the data accessing method can skip the bad columns of the flash memory 180 according to the bad column data sets, wherein the first bad column data set can save memory space and reduce the workload of the controller by recording continuously bad columns using only two data units.

Data transmission methods, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a flash memory, comprises a plurality of dies, and a bad column table, and each of the dies has a plurality of columns, wherein each of the columns is constituted by a plurality of sectors; and
a controller, performing a read operation or a write operation from a first column to an Nth column of the columns in response to a read command or a write command, reading the bad column table during or before the read operation or the write operation to obtain the first bad column data set, and skipping at least two columns within the range of the first column to the Nth column according to a first bad column data set during the read operation and the write operation, wherein the first bad column data set has first data and second data, the first data is a starting address, and the second is a number of columns;
wherein the bad column table further comprises a second bad column data set, the controller skips one column within the range of the first column to the Nth column during the read operation and the write operation in response to the second bad column data set, wherein the second bad column data set comprises third data, the third data indicates an address of one of the columns; and
wherein N is a positive integer and the value of the N is greater than 3.

2. The data storage device as claimed in claim 1, wherein the controller determines the die which is going to be accessed in response to the read command or the write command, and reads the data corresponding to the determined die from the bad column table.

3. A data accessing method, applied to a data storage device, wherein the data storage device comprise a flash memory, the flash memory comprises a plurality of dies, and each of the dies has a plurality of columns constituted by a plurality of sectors, and the data accessing method comprises:
receiving a read command indicating to read from a first column to an Nth column of the columns or a write command indicating to write data from the first column to the Nth column;
reading at least one first bad column data set corresponding to the die which is going to be accessed from a bad column table; and
performing a read operation from the first column to the Nth column in response to the read command or performing a write operation from the first column to the Nth column in response to the write command, and skipping at least two columns within the range of the first column to the Nth column according to the obtained first bad column data set during the read operation and the write operation, wherein the first bad column data set comprises first data and second data, the first data is a starting address, and the second data is a number of columns;
wherein the bad column table comprises a plurality of die areas, each of the die areas is arranged to store a plurality of bad column data sets of the corresponding die;
wherein the bad column data set comprises the first data and the second data, the second bad column data set comprises third data, the third data indicates an address of one of the columns; and
wherein N is a positive integer and the value of the N is greater than 3.

* * * * *